United States Patent
Wang et al.

(10) Patent No.: US 9,068,273 B2
(45) Date of Patent: *Jun. 30, 2015

(54) ELECTROCHEMICAL REMOVAL OF TANTALUM-CONTAINING MATERIALS

(75) Inventors: Hong Wang, Cupertino, CA (US); Kenneth Tsai, Emerald Hills, CA (US)

(73) Assignee: Quantum Global Technologies LLC, Dublin, PA (US)

( * ) Notice: Subject to any disclaimer, the term of this patent is extended or adjusted under 35 U.S.C. 154(b) by 500 days.

This patent is subject to a terminal disclaimer.

(21) Appl. No.: 13/157,867

(22) Filed: Jun. 10, 2011

(65) Prior Publication Data

US 2012/0000793 A1 Jan. 5, 2012

Related U.S. Application Data

(63) Continuation of application No. 10/870,716, filed on Jun. 17, 2004, now Pat. No. 7,964,085, which is a continuation-in-part of application No. 10/742,604, filed on Dec. 19, 2003, now Pat. No. 6,902,627, and a continuation-in-part of application No. 10/304,535, filed on Nov. 25, 2002, now Pat. No. 6,902,628.

(51) Int. Cl.
| | |
|---|---|
| *C25F 3/00* | (2006.01) |
| *C25F 3/02* | (2006.01) |
| *C25F 1/00* | (2006.01) |
| *C25F 1/02* | (2006.01) |
| *C25F 5/00* | (2006.01) |
| *C23C 14/34* | (2006.01) |
| *C23F 1/36* | (2006.01) |
| *C22B 7/00* | (2006.01) |

(52) U.S. Cl.
CPC . *C25F 5/00* (2013.01); *C22B 7/007* (2013.01); *C23C 14/3414* (2013.01); *C23F 1/36* (2013.01)

(58) Field of Classification Search
CPC ............... C25F 3/16; C25F 3/02; C25F 3/00; C25F 1/00; C25F 1/02
USPC ............... 205/640, 650, 673–686, 704–711, 205/717–723

See application file for complete search history.

(56) References Cited

U.S. PATENT DOCUMENTS 1,041,790 A * 10/1912 Herrmann ..................... 205/138
2,705,500 A    4/1955 Deer
(Continued)

FOREIGN PATENT DOCUMENTS

| DE | 19719133 A1 | 11/1998 |
|---|---|---|
| EP | 0239349 A2 | 9/1987 |

(Continued)

OTHER PUBLICATIONS

Kirk-Othmer Encyclopedia of Chemical Technology, Aug. 17, 2001, "Tantalum and Tantalum Compounds."

(Continued)

*Primary Examiner* — Zulmariam Mendez
(74) *Attorney, Agent, or Firm* — Fox Rothschild LLP

(57) ABSTRACT

A method of cleaning metal-containing deposits from a metal surface of a process chamber component includes immersing the metal surface in an electrochemical cleaning bath solution. A negative electrical bias is applied to the metal surface to electrochemically clean the metal-containing deposits from the metal surface. The cleaning method is capable of removing metal-containing deposits such as tantalum-containing deposits from the metal surface substantially without eroding the surface, and may be especially advantageous in the cleaning of components having textured surfaces.

11 Claims, 3 Drawing Sheets

(56) References Cited

U.S. PATENT DOCUMENTS

| | | | |
|---|---|---|---|
| 3,033,769 A * | 5/1962 | Cortes | 205/678 |
| 3,117,833 A | 1/1964 | Niwa et al. | |
| 3,239,440 A * | 3/1966 | Covington | 205/674 |
| 3,457,151 A | 7/1969 | Laube | |
| 3,522,083 A | 7/1970 | Woolman | |
| 3,565,771 A | 2/1971 | Gulla | |
| 3,679,460 A | 7/1972 | Reid | |
| 4,060,467 A * | 11/1977 | Maeda et al. | 205/658 |
| 4,100,252 A | 7/1978 | Pitts | |
| 4,126,523 A * | 11/1978 | Wong | 205/212 |
| RE31,198 E | 4/1983 | Binns | |
| 4,419,201 A | 12/1983 | Levinstein et al. | |
| 4,491,496 A | 1/1985 | Laporte et al. | |
| 4,673,554 A | 6/1987 | Niwa et al. | |
| 4,713,119 A | 12/1987 | Earhart et al. | |
| 4,717,462 A | 1/1988 | Homma et al. | |
| 4,756,322 A | 7/1988 | Lami | |
| 4,959,105 A | 9/1990 | Neidiffer et al. | |
| 5,009,966 A | 4/1991 | Garg et al. | |
| 5,032,469 A | 7/1991 | Merz et al. | |
| 5,064,511 A | 11/1991 | Gobbetti | |
| 5,104,501 A | 4/1992 | Okabayashi | |
| 5,164,016 A | 11/1992 | Henriet et al. | |
| 5,180,322 A | 1/1993 | Yamamoto et al. | |
| 5,180,563 A | 1/1993 | Lai et al. | |
| 5,202,008 A | 4/1993 | Talieh et al. | |
| 5,215,624 A | 6/1993 | Dastolfo, Jr. et al. | |
| 5,248,386 A | 9/1993 | Dastolfo, Jr. et al. | |
| 5,338,367 A | 8/1994 | Henriet et al. | |
| 5,366,585 A | 11/1994 | Robertson et al. | |
| 5,391,275 A | 2/1995 | Mintz | |
| 5,401,319 A | 3/1995 | Banholzer et al. | |
| 5,474,649 A | 12/1995 | Kava et al. | |
| 5,509,558 A | 4/1996 | Imai et al. | |
| 5,520,740 A | 5/1996 | Kanai et al. | |
| 5,536,723 A | 7/1996 | Loscalzo et al. | |
| 5,549,802 A | 8/1996 | Guo | |
| 5,587,039 A | 12/1996 | Salimian et al. | |
| 5,660,640 A | 8/1997 | Laube | |
| 5,714,010 A | 2/1998 | Matsuyama et al. | |
| 5,808,270 A | 9/1998 | Marantz et al. | |
| 5,840,434 A | 11/1998 | Kojima et al. | |
| 5,853,847 A | 12/1998 | Takahashi | |
| 5,858,100 A | 1/1999 | Maeda et al. | |
| 5,879,523 A | 3/1999 | Wang et al. | |
| 5,903,428 A | 5/1999 | Grimard et al. | |
| 5,910,338 A | 6/1999 | Donde | |
| 5,916,378 A | 6/1999 | Bailey et al. | |
| 5,916,454 A | 6/1999 | Richardson et al. | |
| 5,939,146 A | 8/1999 | Lavernia | |
| 5,953,827 A | 9/1999 | Or et al. | |
| 5,967,047 A | 10/1999 | Kuhn et al. | |
| 5,976,327 A | 11/1999 | Tanaka | |
| 6,016,465 A | 1/2000 | Kelly | |
| 6,051,114 A | 4/2000 | Yao et al. | |
| 6,059,945 A | 5/2000 | Fu et al. | |
| 6,120,621 A | 9/2000 | Jin et al. | |
| 6,120,640 A | 9/2000 | Shih et al. | |
| 6,139,763 A * | 10/2000 | Ina et al. | 216/89 |
| 6,152,071 A | 11/2000 | Akiyama et al. | |
| 6,306,489 B1 | 10/2001 | Hellmann et al. | |
| 6,306,498 B1 | 10/2001 | Yuuki et al. | |
| 6,338,906 B1 | 1/2002 | Ritland et al. | |
| 6,379,575 B1 | 4/2002 | Yin et al. | |
| 6,383,459 B1 | 5/2002 | Singh et al. | |
| 6,394,023 B1 | 5/2002 | Crocker | |
| 6,444,083 B1 | 9/2002 | Steger et al. | |
| 6,454,870 B1 | 9/2002 | Brooks | |
| 6,555,471 B2 | 4/2003 | Sandhu et al. | |
| 6,565,984 B1 | 5/2003 | Wu et al. | |
| 6,566,161 B1 | 5/2003 | Rosenberg et al. | |
| 6,592,830 B1 | 7/2003 | Krupin et al. | |
| 6,615,852 B1 * | 9/2003 | Kitahara | 134/111 |
| H2087 H | 11/2003 | Baillett et al. | |
| 6,777,045 B2 | 8/2004 | Lin et al. | |
| 6,902,627 B2 | 6/2005 | Brueckner et al. | |
| 6,902,628 B2 | 6/2005 | Wang et al. | |
| 6,933,025 B2 | 8/2005 | Lin et al. | |
| 7,026,009 B2 | 4/2006 | Lin et al. | |
| 2001/0033706 A1 | 10/2001 | Shimomura et al. | |
| 2002/0090464 A1 | 7/2002 | Jiang et al. | |
| 2002/0130049 A1 * | 9/2002 | Chen et al. | 205/640 |
| 2003/0026917 A1 | 2/2003 | Lin et al. | |
| 2003/0047464 A1 | 3/2003 | Sun et al. | |
| 2003/0108680 A1 | 6/2003 | Gell et al. | |
| 2003/0116276 A1 | 6/2003 | Weldon et al. | |
| 2003/0118731 A1 | 6/2003 | He et al. | |
| 2003/0136428 A1 | 7/2003 | Krogh | |
| 2003/0170486 A1 | 9/2003 | Austin et al. | |
| 2003/0173526 A1 | 9/2003 | Popiolkowski et al. | |
| 2003/0185965 A1 | 10/2003 | Lin et al. | |
| 2003/0196890 A1 | 10/2003 | Le et al. | |
| 2003/0221702 A1 | 12/2003 | Peebles | |
| 2004/0045574 A1 | 3/2004 | Tan | |
| 2004/0056211 A1 | 3/2004 | Popiolkowski et al. | |
| 2004/0099285 A1 | 5/2004 | Wang et al. | |
| 2004/0180158 A1 | 9/2004 | Lin et al. | |
| 2005/0028838 A1 | 2/2005 | Brueckner | |
| 2005/0048876 A1 | 3/2005 | West et al. | |
| 2006/0105182 A1 | 5/2006 | Brueckner et al. | |
| 2006/0110620 A1 | 5/2006 | Lin et al. | |

FOREIGN PATENT DOCUMENTS

| | | | |
|---|---|---|---|
| EP | 0838838 | A2 | 4/1998 |
| EP | 0845545 | A1 | 6/1998 |
| EP | 1049133 | A2 | 11/2000 |
| EP | 1158072 | A2 | 11/2001 |
| EP | 1258908 | A2 | 11/2002 |
| FR | 2562097 | A1 | 10/1985 |
| JP | 54162696 | A | 12/1979 |
| JP | 54162969 | A | 12/1979 |
| JP | 63149396 | A | 6/1988 |
| JP | 63235435 | A | 9/1988 |
| JP | 1159368 | A | 6/1989 |
| JP | 02101157 | A | 4/1990 |
| JP | 2250990 | A | 10/1990 |
| JP | 03138354 | A | 6/1991 |
| JP | 07197272 | A | 8/1995 |
| JP | 09272965 | A | 10/1997 |
| JP | 10045461 | A | 2/1998 |
| JP | 10251871 | A | 9/1998 |
| JP | 10330971 | A | 12/1998 |
| JP | 11137440 | A | 5/1999 |
| JP | 11220164 | A | 8/1999 |
| JP | 11229164 | A | 8/1999 |
| JP | 11283972 | A | 10/1999 |
| JP | 11345780 | A | 12/1999 |
| JP | 2000072529 | A | 3/2000 |
| JP | 2000191370 | A | 7/2000 |
| JP | 2000228398 | A | 8/2000 |
| JP | 2000265276 | A | 9/2000 |
| JP | 2002069695 | A | 3/2002 |
| JP | 2002069696 | A | 3/2002 |
| JP | 2002292346 | A | 10/2002 |
| TW | 546680 | B | 8/2003 |
| WO | WO-9850599 | A2 | 11/1998 |
| WO | WO-9917336 | A1 | 4/1999 |
| WO | WO-0215255 | | 2/2002 |
| WO | WO-03083160 | A2 | 10/2003 |
| WO | WO-06073585 | A2 | 7/2006 |

OTHER PUBLICATIONS

Rosenberg, R.W., "Increasing PVD Tool Uptime and Particule Control with Twin-Wire-Arc Spray Coatings," Mar. 2001, pp. 103-105, 108, 111, vol. 19, No. 3, Cannon Comm., Santa Monica, California.

* cited by examiner

ELECTROCHEMICAL REMOVAL OF TANTALUM-CONTAINING MATERIALS

CROSS-REFERENCE

This application is a continuation of U.S. patent application Ser. No. 10/870,716, filed on Jun. 17, 2004, now U.S. Pat. No. 7,964,085, and entitled "Electrochemical Removal of Tantalum-Containing Materials," which is hereby incorporated by reference in its entirety; that patent is a continuation-in-part of U.S. patent application Ser. No. 10/742,604, and filed on Dec. 19, 2003, now U.S. Pat. No. 6,902,627, entitled "Cleaning Chamber Surfaces to Recover Metal-Containing Compounds," which is herein incorporated by reference in its entirety; that patent is a continuation-in-part of U.S. patent application Ser. No. 10/304,535, now U.S. Pat. No. 6,902,628, entitled "Method of Cleaning a Coated Process Chamber Component," and filed on Nov. 25, 2002, which is herein incorporated by reference in its entirety.

FIELD

The field of this disclosure relates to the cleaning and recovery of metal-containing residues from surfaces.

BACKGROUND

In the processing of substrates, such as semiconductor wafers and displays, a substrate is placed in a process chamber and exposed to an energized gas to deposit or etch material on the substrate. During such processing, process residues are generated and deposited on internal surfaces in the chamber. For example, in sputter deposition processes, material sputtered from a target for deposition on a substrate also deposits on other component surfaces in the chamber, such as on deposition rings, cover rings, shadow rings, inner shield, upper shield, wall liners, and focus rings. In subsequent process cycles, the deposited process residues can "flake off" of the chamber component surfaces to fall upon and contaminate the substrate. Consequently, the deposited process residues are periodically cleaned from the chamber surfaces.

However, it is difficult to clean process deposits that contain metals from chamber components, such as for example tantalum and tantalum nitride metals, especially when the components themselves are made of metal-containing materials.

For example, when tantalum is sputter deposited onto the substrate, some of the sputtered tantalum deposits upon the adjacent chamber component surfaces. These tantalum deposits are difficult to remove because cleaning solutions suitable for their removal are also frequently reactive with other metals, such as titanium, aluminum, copper and stainless steel, which are used to form chamber components. Cleaning of tantalum-containing materials from such surfaces can erode the components and require their frequent replacement. The erosion of metal surfaces can be especially problematic when cleaning textured metal surfaces. These surfaces can have crevices and pores in which tantalum-containing process residues get lodged, making it difficult to remove these residues with conventional cleaning processes.

When conventional cleaning methods are used to clean metals such as tantalum, a relatively large amount of the metal-containing material generated in these processes is typically not recoverable. For example, it is estimated that in many tantalum deposition processes, only about one-half of the sputtered tantalum material is deposited on the substrate, the rest being deposited on component surfaces within the chamber. Conventional cleaning methods frequently dispose of the used cleaning solutions along with the dissolved tantalum material. Thus, a large amount of tantalum material is wasted after it is cleaned off the chamber surfaces, resulting in an estimated loss of about 10,000 to about 30,000 pounds of tantalum per year. The disposal of metals such as tantalum is environmentally undesirable and costly because high purity tantalum is expensive and fresh cleaning solution also has to be acquired.

Thus, it is desirable to have a method of cleaning metal-containing deposits such as tantalum-containing deposits from surfaces of components without excessively eroding the surfaces. It is also desirable to reduce the waste of the tantalum materials cleaned off the chamber surfaces, for example by recovering the tantalum materials.

SUMMARY

One embodiment is an apparatus. The apparatus includes an electrochemical bath for immersing a metal part in a solution contained within the bath and for cleaning metal-containing deposits from a surface of the metal part. The apparatus also includes a voltage source for connecting to a cathode and an anode and an anode for connecting to a positive terminal of the voltage source, the anode for immersion in the solution contained within the electrochemical bath, wherein a negative terminal of the voltage source is adapted for connecting to the metal part for immersing in the electrochemical bath for cleaning metal-containing deposits from the surface of the metal part.

Another embodiment is a method of cleaning and recovering metal-containing deposits from a metal surface. The method includes steps of (a) immersing the metal surface having the metal-containing deposits thereon in an electrochemical cleaning bath solution, (b) applying a negative electrical bias to the metal surface to electrochemically remove the metal-containing deposits from the metal surface, and (c) collecting the metal-containing deposits from the solution.

Another embodiment is a method of cleaning and recovering tantalum-containing deposits from a metal surface. The method includes steps of (a) immersing the metal surface in the electrochemical cleaning bath solution, wherein the electrochemical cleaning bath solution comprises an acidic solution maintained at a temperature below about 75° C.; (b) applying a negative electrical bias to the metal surface while passing a current through the metal surface, thereby electrochemically removing the tantalum-containing deposits from the textured metal surface; (c) ultrasonically agitating the metal surface to loosen tantalum-containing deposits on the metal surface; (d) propelling blasting beads towards the metal surface with a pressurized gas to remove tantalum-containing deposits from the metal surface; and (e) collecting the tantalum-containing deposits from the solution.

In another version, a method of cleaning tantalum-containing deposits from a textured metal surface of a process chamber component includes immersing the textured metal surface in the electrochemical cleaning bath solution. The electrochemical cleaning bath solution is a solution of $H_2SO_4$ that is maintained at a temperature below about 75° C. A negative electrical bias is applied to the textured metal surface while a current density of from about 0.1 Amps/inch$^2$ to about 5 Amps/inch$^2$ is passed through the textured metal surface to electrochemically remove tantalum-containing deposits from the textured metal surface. The textured metal surface is ultrasonically agitated to loosen tantalum-containing deposits on the textured metal surface. Moderate bead blasting can be performed by propelling blasting beads towards the textured metal surface with a pressurized gas to break up and remove loosened tantalum-containing deposits from the textured metal surface.

BRIEF DESCRIPTION OF THE DRAWINGS

These features, aspects, and advantages of the present disclosure will become better understood with regard to the following description, appended claims, and accompanying drawings, which illustrate examples of the invention. However, it is to be understood that each of the features can be used in many embodiments, not merely in the context of the particular drawings, and the embodiments include any combination of these features, where:

DETAILED DESCRIPTION

Figure 1:
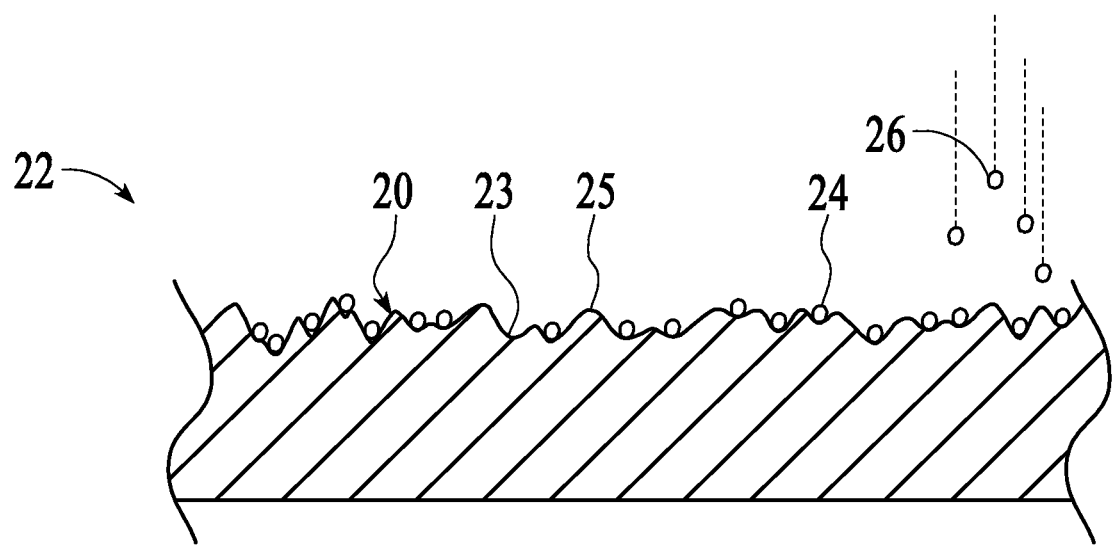
FIG. 1 is a schematic side view of an embodiment of a component having a surface with metal-containing deposits thereon.

A process chamber component 22 having a surface 20 is cleaned to remove metal-containing process deposits 24 that are generated during processing of a substrate 104, such as tantalum-containing deposits 24. An embodiment of a chamber component having metal-containing deposits 24 is shown for example in FIG. 1. The tantalum-containing deposits 24 can comprise, for example, at least one of tantalum metal, tantalum nitride and tantalum oxide. Other metal-containing deposits 24 may comprise, for example, at least one of titanium, cobalt, nickel and tungsten-containing deposits. Performing a cleaning process to remove the metal-containing deposits 24 can reduce the formation of contaminant particles in the chamber 106, improve substrate yields, and allow recovery of the metal from the cleaning solution. The cleaning process can be performed after the component 22 has been removed from the process chamber 106. The chamber components 22 to be cleaned are those that accumulate metal deposits such as tantalum-containing process deposits 24. For example, the components 22 can comprise portions of a gas delivery system 112 that provides process gas in the chamber 106, a substrate support 114 that supports the substrate 104 in the chamber 106, a gas energizer 116 that energizes the process gas, chamber enclosure walls 118 and shields 120, or a gas exhaust 180 that exhausts gas from the chamber 106, exemplary embodiments of which are shown in FIG. 3.

Figure 3:
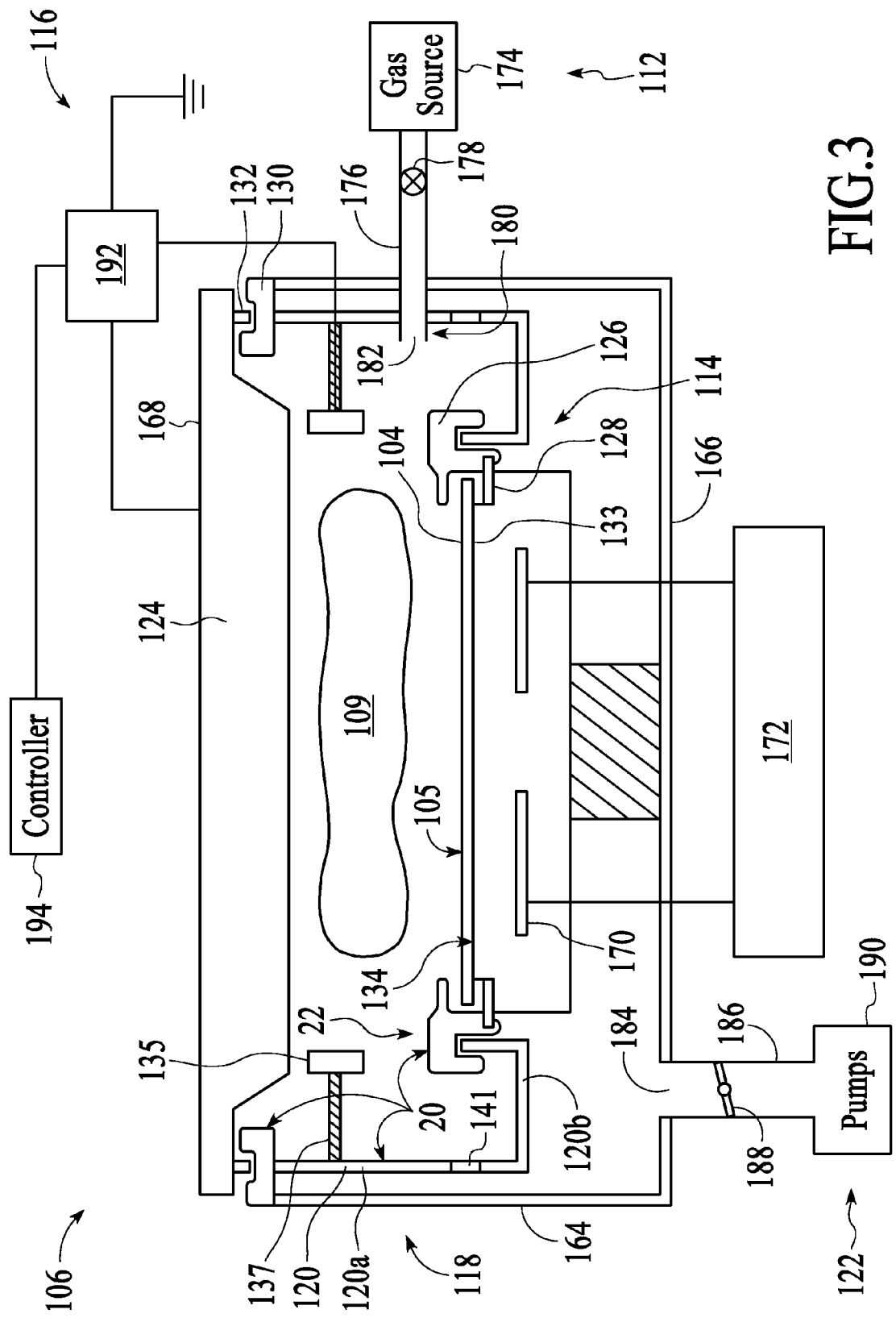
FIG. 3 is a sectional side view of an embodiment of a process chamber having one or more components that can be cleaned of metal-containing deposits in a cleaning process.

Referring to FIG. 3, which illustrates an embodiment of a physical vapor deposition chamber 106, components 22 that can be cleaned include a chamber enclosure wall 118, a chamber shield 120, upper and lower shields 120a,b, a target 124, a cover ring 126, a deposition ring 128, a support ring 130, insulator ring 132, a coil 135, coil support 137, shutter disk 133, clamp shield 141, and a surface 134 of the substrate support 114. The components 22 can have surfaces 20 comprising metal, such as at least one of titanium, stainless steel, aluminum, copper and tantalum. Component surfaces 22 can also comprise a ceramic material, such as at least one of aluminum oxide, aluminum nitride, and silicon carbide.

In one version of the cleaning method, a component 22 having a metal surface 20 is cleaned to remove metal-containing deposits 24 such as tantalum-containing deposits by performing an improved electrochemical cleaning process. In the improved electrochemical cleaning process, the metal surface 20 is immersed in an electrochemical cleaning bath 33 comprising an electrochemical cleaning bath solution, as shown for example in FIG. 2. The metal-containing deposits 24 are then removed from the metal surface 20 by applying a negative electrical bias to the metal surface 20.

Figure 2:
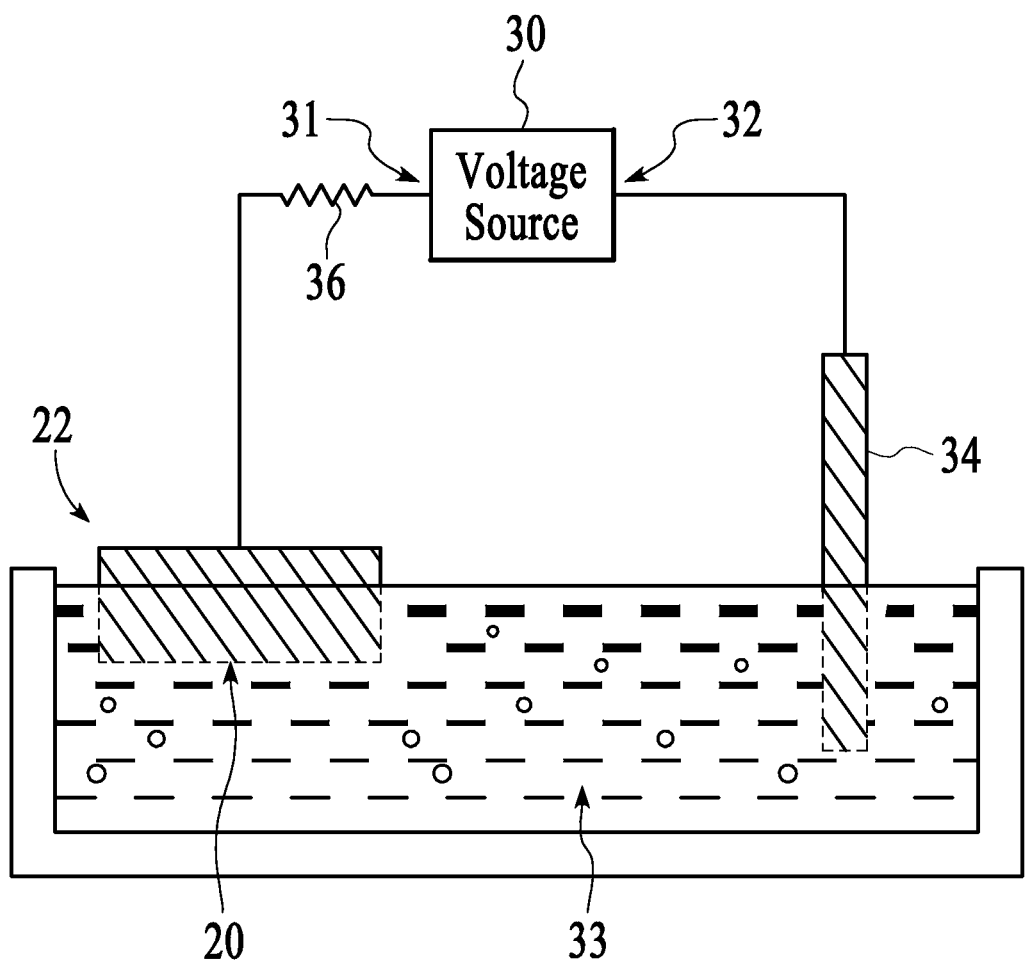
FIG. 2 is a schematic side view of an embodiment of an electrochemical cleaning apparatus.

For example, as shown in FIG. 2, the component 22 can be electrically connected to a voltage source 30 such as a battery or other electrical current generator, which is capable of providing a current to the metal surface 20 that negatively electrically biases the metal surface 20. The negatively biased metal surface 20 thus serves as a cathode and is connected to a negative terminal 31 of the voltage source 30. A second electrode 34 is also provided in the electrochemical cleaning bath 33 to serve as an anode 34, and may comprise, for example, a lead electrode or also an electrode comprising platinum or graphite. The anode 34 is electrically connected to a positive terminal 32 of the voltage source 30, and thus completes an electrical path with the metal surface 20 through the electrochemical cleaning bath. The improved electrochemical cleaning method provides good results for the cleaning of metal-containing deposits 24 such as tantalum-containing deposits 24.

In one version of the electrochemical cleaning process, the voltage source 30 supplies a voltage that has an amplitude and sign that are suitable to negatively electrically bias the metal surface 20. The voltage source 30 also desirably generates a DC current, to provide a continuous negative bias to the metal surface 20. The voltage source 30 is capable of generating a current that is sufficient to pass a desired current density through the surface 20 to provide the desired electrical bias amplitude. For example, a current density suitable for electrochemically cleaning the metal surface 20 may be a current density of from about 0.1 Amps/inch$^2$ to about 5 Amps/inch$^2$, such as about 0.3 Amps/inch$^2$. A suitable voltage generated by the voltage source 30 to provide this current density may be a voltage of from about 1 Volt to about 20 Volts, such as about 3 Volts. A resistor 36 may also be provided in the electrical path to adjust the current density provided by the voltage source 30. For example, a resistor having a resistance of from about 10 to 500 Ohms may be provided. A power applied to the surface 20 may be equivalent to a power level of from about 10 Watts to about 1,000 Watts, depending on the structure and requirements of the electrochemical cleaning apparatus. A distance between the metal surface 20 and anode 34 may be from about 2 inches to about 24 inches, such as about 5 inches, and a suitable duration of the electrochemical cleaning process may be from about 1 hour to about 15 hours, such as about 6 hours.

Furthermore, electrode configurations and methods of electrically biasing the metal surface 20 other than those specifically shown in FIG. 2 can also be provided. For example, multiple anodes 34 can be provided in the electrochemical cleaning bath 33, such as anodes 34 positioned at two or four opposing sides of the electrochemical cleaning bath 33. The anode 34 may also comprise a protective anode bag (not shown) about the anode 34 that comprises a mesh material capable of inhibiting the flow of particles through the anode bag. Also, a plurality of component surfaces 22 can be simultaneously immersed and cleaned in the electrochemical cleaning bath 33 to improve the cleaning efficiency.

The discovery that electrochemical cleaning of metal-containing deposits 24 such as tantalum-containing deposits 24 could be provided by applying a negative electrical bias to the metal surface 20 was unexpected. This is because other electrochemical processes to clean metals, such as for example copper cleaning processes, typically involve positively electrically biasing the metals to dissolve the metals. The positive electrical bias oxidizes metals and can convert the metals into an ionic form or oxide form (anodic film) that is soluble in an electrochemical solution. The fact that metal deposits such as tantalum-containing deposits 24 could be removed from a surface 20 by applying the opposite (negative) electrical bias to the surface 20, and with such good cleaning results, was thus an unexpected surprise.

Without limiting the invention to any single mechanism, it is believed that a possible explanation of these unexpectedly good results, for example in the cleaning of tantalum-containing deposits 24, may be that the negative electrical bias of the surface 20 attracts hydrogen ions (H+) from the electrochemical cleaning bath solution. The hydrogen ions can react with at least some of the tantalum-containing deposits 24, forming hydrogen-containing compounds such as tantalum hydride ($Ta_2H$) on the surface 20 of the component. However, because $Ta_2H$ has a large molar volume (about 23.1 $cm^3$/mol) in comparison to tantalum-containing deposits such as TaN (about 14.2 $cm^3$/mol), the formation of the hydrides generates localized stresses in the residues deposited on the surface. The localized stresses induce flaking and spalling of the tantalum-containing deposits 24 from the metal surface 20, thereby cleaning the metal surface 20.

This hypothesis is also supported by the electrochemical cleaning results on textured metal surfaces 20, which show cracking and flaking of the deposits 24 in a pattern that is periodic and related to the surface texture morphology. The periodic cracking pattern is consistent with the penetration of hydrogen ions at susceptible textured surface regions. Also, metal surfaces 20 that are textured may show particularly good cleaning results for such an electrochemical cleaning process because the textured surface can induce additional stresses in the tantalum-containing deposits due to an uneven distribution of deposits 24 across the textured surface 20. The textured metal surface 20 can also allow for the penetration of hydrogen ions into the deposits 24 where cracks or openings in the deposit layer occur. Furthermore, as the metal surface 20 is negatively biased during the electrochemical cleaning process, the surface itself is not excessively electrochemically eroded by the process, allowing for cleaning of the surface substantially without erosion of the metal surface 20. While this mechanism is described for the cleaning of tantalum-containing deposits 24, it is believed that similar mechanisms may also clean other metal-containing deposits 24. For example, the application of the negative electrical bias may be capable of cleaning metal-containing deposits 24 comprising at least one of titanium, cobalt, nickel and tungsten-containing deposits.

The improved electrochemical cleaning process can also be beneficial because it provides enhanced removal of the metal-containing deposits 24 without requiring large amounts of harsh chemical etchants to chemically etch away the deposits 24. The process can also be especially beneficial in the removal of metal-containing residues from metal surface materials such as titanium, aluminum and copper, which have chemical etching reactivities that are similar to metals such as tantalum and thus are easily eroded by such chemical etchants. Yet another benefit of the process is that a substantial portion of the metal-containing deposits 24 that flake from the metal surface 20, such as tantalum nitride deposits, remain insoluble in the electrochemical cleaning bath 33, and can be readily collected from electrochemical cleaning bath 33, for example, by filtering the cleaning bath solution.

The electrochemical cleaning bath solution comprises a composition that is capable of removing metal-containing deposits 24 such as tantalum-containing deposits 24 without excessively etching the surface 20 of the component 22. The electrochemical cleaning bath solution desirably comprises a composition that is substantially non-reactive with the metal surface 20, to inhibit etching of the surface 20, and may also desirably be non-reactive with the anode 34. In one version, the electrochemical cleaning bath solution comprises an acidic solution that is capable of generating hydrogen ions (H+) to promote formation of hydrogen-containing compounds on the surface 20.

A suitable acidic solution may comprise, for example, sulfuric acid ($H_2SO_4$), which has been found to promote flaking of the metal-containing deposits such as tantalum-containing deposits 24 from the surface 20, substantially without excessively eroding the underlying surface 20 or anode material. In one version, the electrochemical cleaning bath solution is formed by taking from about 20 mL to about 30 mL, such as about 27 mL of a stock solution comprising from about 96% to about 98% by weight $H_2SO_4$, and diluting to a total volume of 1 L. The resulting concentration of $H_2SO_4$ in the electrochemical cleaning bath solution is from about 0.36 moles/L to about 0.54 moles/L, such as about 0.49 moles/L. A suitable pH of the electrochemical cleaning bath solution is desirably low enough to provide a sufficient concentration of H+ ions in the solution. For example, a suitable pH of the solution may be in the range of from about 1.0 to about 3.0, such as a pH of from about 1.1 to about 1.4, and even desirably from about 1.2 to about 1.3. The electrochemical bath solution may also be stirred or agitated during the electrochemical cleaning process, for example with a stirring bar or stirring blade, as well as via ultrasonic agitation, to provide fresh electrochemical cleaning bath solution to the metal surface 20.

In one version, a temperature of the electrochemical cleaning bath solution is carefully controlled to provide optimum conditions for the electrochemical cleaning process. Higher temperatures may increase the rate of removal of metal-containing deposits 24 such as tantalum-containing deposits 24 from the surface 20 by promoting the formation of hydrogen-containing compounds on the surface 20. However, temperatures that are too high may result in excessive differences in the thermal expansion rates of the surface 20 and the metal-containing deposits 24, which can lead to the trapping of metal-containing deposits in crevices or depressions in the surface 20, especially for metal surfaces 20 that have been textured. A suitable temperature of the electrochemical cleaning bath solution has thus been found to be less than about 75° C., and even less than about 70° C., such as from about 10° C. to about 70° C. In one version, the electrochemical cleaning bath solution is maintained at a temperature of from about 20° C. to about 60° C., such as about 30° C.

In one version, the removal of the metal-containing deposits 24 is improved by providing ultrasonic agitation of the metal surface 20. For example, the metal surface 20 can be ultrasonically agitated by introducing sound waves to the metal surface 20 to lightly shake the surface 20. The ultrasonic waves can be generated by, for example, mounting an ultrasonic transducer on the component 22, or mounting the transducer on a portion of the electrochemical cleaning bath vessel or a separate ultrasonic cleaning vessel. The ultrasonic waves can comprise sonic energy having a frequency of, for example, from about 10 kHz to about 100 kHz. The ultrasonic agitation loosens metal-containing deposits 24 on the surface 20 to delaminate the deposits 24 from the surface 20, and can also break off deposits 24 that were partially delaminated but still adhering to the surface 20. In one version, the metal surface 20 is ultrasonically agitated during the electrochemical cleaning process to promote removal of the metal-containing deposits 24. The metal surface 20 may also be ultrasonically agitated before or after the electrochemical cleaning process, for example in a separate ultrasonic cleaning system (not shown), to remove the metal-containing deposits 24.

In one version, metal-containing deposits 24 remaining on the metal surface 20 can be removed by bead blasting the deposits 24 from the metal surface 20 in a moderate bead blasting process. In a bead blasting process, a stream of hard bead particles 26 is propelled toward the surface 20 by gas that is pressurized to a pressure sufficiently high to remove remaining metal-containing deposits 24 from the surface 20. For example, a suitable pressure may be from about 80 PSI to about 150 PSI. The blasting beads 26 may comprise a particle size of from about 20 micrometers to about 100 micrometers, such as about 50 micrometers. A bead blast sprayer may be operated at suitable parameters to provide the desired blasting bead conditions, such as a voltage of about 115 Volts and a pressurized air flow rate of about 1 SCFM through the bead blast sprayer. The bead blasting process is effective at removing metal-containing deposits that may still be loosely adhered to the metal surface 20.

In one version of an exemplary cleaning process to remove metal-containing deposits 24 such as tantalum-containing deposits 24, an electrochemical cleaning process is performed by immersing the surface 20 of the component 22 in an electrochemical cleaning bath solution comprising a desired composition and temperature. A current is calculated according to the surface area of the surface 20 to provide a desired current density through the surface 20, and a sufficient voltage is supplied by the voltage source 30 to achieve the desired current density. The electrochemical cleaning bath solution is agitated, for example by stirring with a magnetic stirring bar. The surface 20 can also be ultrasonically agitated while immersed in the electrochemical cleaning bath. Electrochemical cleaning of the surface 20 is continued for a duration sufficient to clean the surface 20, such as about 6 hours. If the surface 20 is not ultrasonically agitated during the electrochemical cleaning, the component 22 can be ultrasonically cleaned in a separate ultrasonic cleaning device after electrochemically cleaning, for example for about 10 minutes, to further loosen and remove the metal-containing residues 24.

The surface 20 of the component 22 can then be tested to determine whether the cleaning process has sufficiently loosened and removed the deposits. For example, the surface 20 can be tested to see if the remaining metal-containing deposits 24 can be easily mechanically removed from the surface 20, by pressing a pointed device such as a needle, scalpel or awl against the metal surface 20. If the metal-containing deposits 24 remain strongly adhered to the surface 20, then the electrochemical cleaning and ultrasonic agitation can be repeated, and the surface 20 re-tested. Once the metal-containing deposits 24 can be easily mechanically removed, the component surface 20 is dried and a bead blasting process is performed to blast remaining deposits 24 from the surface 20. A final ultrasonic cleaning process can then be performed before the component surface 20 is rinsed, dried, and inspected for any remaining metal-containing deposits 24.

The component 22 may also be subjected to cleaning processes other than those described, such as for example pre-cleaning of the component surface 20 before the electrochemical cleaning process, for example by immersing in a solution comprising HF and $HNO_3$, as described for example in U.S. patent application Ser. No. 10/742,604, now U.S. Pat. No. 6,902,627, and U.S. patent application Ser. No. 10/304,535, now U.S. Pat. No. 6,902,628, both of which were incorporated by reference in their entireties above. The cleaned component 22 may be provided in a process chamber 106 to process substrates 104 substantially without generating contaminant particles.

The electrochemical cleaning method is particularly suitable for surfaces 20 that are textured, as shown for example in FIG. 1. Components 22 having textured surfaces reduce particle generation in the process chamber by providing a "sticky" surface to which process residues adhere. In one version, components 20 cleaned of tantalum-containing deposits include components having surfaces textured by a "Lavacoat™" process, such as for example components described in U.S. patent application Ser. No. 10/653,713 to West, et al, filed on Sep. 2, 2003, entitled "Fabricating and Cleaning Chamber Components Having Textured Surfaces;" U.S. patent application Ser. No. 10/099,307, filed Mar. 13, 2002, now U.S. Pat. No. 6,933,508; and U.S. patent application Ser. No. 10/622,178, filed on Jul. 17, 2003, now U.S. Pat. No. 6,812,471, all commonly assigned to Applied Materials, Inc., all of which are incorporated herein by reference in their entireties. The components 22 can also comprise coated components having textured surfaces, such as plasma sprayed coatings or twin-wire arc sprayed coatings, as described in for example the parent of the present application U.S. patent application Ser. No. 10/304,535 to Wang et al, filed on Nov. 25, 2002, now U.S. Pat. No. 6,902,628, commonly assigned to Applied Materials, from which the present application claims priority, and which is also incorporated herein by reference in its entirety.

The "Lavacoat™" textured metal surface 20 is formed by generating an electromagnetic energy beam and directing the beam onto the surface 20 of the component 22. The electromagnetic energy beam is preferably an electron beam, but can also comprise protons, neutrons and X-rays and the like. The electron beam is typically focused on a region of the surface 20 for a period of time, during which time the beam interacts with the surface 20 form features on the surface. It is believed that the beam forms the features by rapidly heating the region of the surface 20, in some cases to a melting temperature of the surface material. The rapid heating causes some of the surface material to be ejected outwards, which forms depressions 23 in the regions the material was ejected from, and protuberances 25 in areas where the ejected material re-deposits.

After the desired features in the region are formed, the beam is scanned to a different region of the component surface 20 to form features in the new region. The final surface 20 can comprise a honeycomb-like structure of depressions 23 and protuberances 25 formed in the surface 20. The features formed by this method are typically macroscopically sized, and the depressions can range in diameter from about 0.1 mm to about 3.5 mm, such as from about 0.8 to about 1.0 mm in diameter. The "Lavacoat™" textured surface 20 has an overall surface roughness average of from about 2500 microinches (63.5 micrometers) to about 4000 microinches (101.6 micrometers), the roughness average of the surface 20 being defined as the mean of the absolute values of the displacements from the mean line of the features along the surface 20.

The instant cleaning methods provide surprisingly good results in cleaning such textured surfaces substantially without eroding the surfaces 20. For example, for a textured metal surface 20 formed of titanium, the cleaning methods described above may clean tantalum-containing residues from the surface 20 while eroding less than about 0.030 $mg/cm^2$ per hour of titanium from the metal surface 20, based on ICP-AES (inductively coupled plasma atomic emission spectroscopy) analysis of the electrochemical cleaning solution. In contrast, conventional tantalum cleaning processes can erode more than about 5 mg/cm² of titanium from a titanium surface of a component 22.

Once cleaning of the component surface 20 has been completed, the electrochemical cleaning solution can be treated to recover metal-containing materials, such as the tantalum-containing materials, which may be at least one of tantalum metal and tantalum oxide. Recovering tantalum-containing materials from the cleaning solution reduces the pollution of the environment by tantalum waste, and can also reduce the costs associated with proper disposal of waste tantalum. The recovered tantalum-containing materials can be re-used in the substrate processing, for example the recovered tantalum materials can be used to form a tantalum-containing target for physical vapor deposition processes. In addition to tantalum recovery, the used cleaning solution can be treated to allow for re-use of the cleaning solution.

An example of a suitable process chamber 106 having a component 200 that is cleaned to remove metal-containing deposits 24 such as tantalum-containing deposits 24 is shown in FIG. 3. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, which is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 114 can also comprise a moveable shutter disk 133 that can protect the upper surface 134 of the support 130 when the substrate 104 is not present. In operation, the substrate 104 is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104 into and out of the chamber 106.

The support 114 may also comprise one or more rings, such as a cover ring 126 and a deposition ring 128, which cover at least a portion of the upper surface 134 of the support 114 to inhibit erosion of the support 130. In one version, the deposition ring 128 at least partially surrounds the substrate 104 to protect portions of the support 114 not covered by the substrate 104. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to form a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, which is capable of reacting with the sputtered material to form a layer on the substrate 104. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104, such as for example at least one of tantalum and tantalum nitride. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 3, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124 and shield 120 operate as a gas energizer 116 that is capable of energizing the sputtering gas to sputter material from the target 124.

The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 114 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 114 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments are shown and described, those of ordinary skill in the art may devise other embodiments, and which are also within the scope of the present invention. For example, other chamber components than the exemplary components described herein can also be cleaned. Additional cleaning and recovery steps other than those described could also be performed. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of cleaning and recovering tantalum-containing deposits from a metal surface, the method comprising:
    (a) immersing the metal surface having the tantalum-containing deposits thereon in an electrochemical cleaning bath solution selected from the group consisting of an acid that is substantially non-reactive with the metal surface, H2SO4 having a concentration of from about 0.36 M to about 0.54 M, and an electrochemical cleaning bath solution comprising a pH of from about 1.1 to about 1.4;
    (b) applying a negative electrical bias to the metal surface to electrochemically remove the tantalum-containing deposits from the metal surface; and
    (c) collecting the tantalum-containing deposits from the solution.

2. A method according to claim 1 wherein (b) comprises applying a current density to the metal surface of from about 0.1 Amps/inch$^2$ to about 5 Amps/inch$^2$.

3. A method according to claim 1 wherein (b) comprises electrically biasing the metal surface by applying a DC current at a voltage of from about 1 Volt to about 20 Volts.

4. A method according to claim 1 wherein (b) further comprises maintaining a temperature of the electrochemical cleaning bath solution below about 75° C.

5. A method according to claim 1 wherein (a) comprises immersing a metal surface comprising at least one of aluminum, titanium, copper, tantalum and stainless steel into the electrochemical cleaning bath solution.

6. A method according to claim 1 further comprising, before, during or after (b), ultrasonically agitating the metal surface.

7. A method according to claim 1 further comprising: (d) propelling blasting beads towards the metal surface with a pressurized gas to remove the metal-containing residues.

8. A method according to claim 1 wherein (a) comprises immersing a textured metal surface comprising projections and depressions in the electrochemical cleaning bath solution.

9. A method of cleaning and recovering tantalum-containing deposits from a metal surface, the method comprising: (a) immersing the metal surface in an electrochemical cleaning bath solution selected from the group consisting of an acid that is substantially non-reactive with the metal surface, H$_2$SO$_4$ having a concentration of from about 0.36 M to about 0.54 M, and an electrochemical cleaning bath solution comprising a pH of from about 1.1 to about 1.4, wherein the electrochemical cleaning bath solution is maintained at a temperature below about 75° C.; (b) applying a negative electrical bias to the metal surface while passing a current through the metal surface, thereby electrochemically removing the tantalum-containing deposits from the metal surface; (c) ultrasonically agitating the metal surface to loosen tantalum-containing deposits on the metal surface; (d) propelling blasting beads towards the metal surface with a pressurized gas to remove tantalum-containing deposits from the metal surface; and (e) collecting the tantalum-containing deposits from the solution.

10. A method according to claim 9 wherein (a) comprises immersing a textured metal surface having depressions with diameters of from about 0.1 mm to about 3.5 mm in the electrochemical cleaning bath solution.

11. A method according to claim 9 wherein (a) comprises immersing a textured metal surface comprising at least one of aluminum, titanium, copper, tantalum and stainless steel into the electrochemical cleaning bath solution.

* * * * *